United States Patent [19]

Skotnicki et al.

[11] Patent Number: 5,552,624
[45] Date of Patent: Sep. 3, 1996

[54] MULTI-FUNCTION ELECTRONIC COMPONENT, ESPECIALLY NEGATIVE DYNAMIC RESISTANCE ELEMENT, AND CORRESPONDING METHOD OF FABRICATION

[75] Inventors: Tomasz Skotnicki, Meylan; Gérard Merckel, Montbonnot, both of France

[73] Assignee: France Telecom, Paris, France

[21] Appl. No.: 86,979

[22] Filed: Jul. 2, 1993

[30] Foreign Application Priority Data

Jul. 9, 1992 [FR] France ................. 92 08502

[51] Int. Cl.$^6$ ................................. H01L 27/01
[52] U.S. Cl. .................. 257/350; 257/348; 257/378; 257/557; 257/577
[58] Field of Search ........................ 257/350, 352, 257/378, 348, 391, 403, 557, 474, 577

[56] References Cited

U.S. PATENT DOCUMENTS

| | | | |
|---|---|---|---|
| 4,032,961 | 6/1977 | Baliga | 357/57 |
| 4,280,854 | 6/1981 | Shibata | 148/1.5 |
| 4,698,899 | 10/1987 | Kakihana | 437/44 |
| 4,864,372 | 9/1989 | Kakihana | 357/22 |
| 4,872,010 | 10/1989 | Larson et al. | 257/348 |
| 4,891,533 | 1/1990 | Holloway | 257/403 |
| 4,914,491 | 4/1990 | Vu | 257/348 |
| 4,922,315 | 5/1990 | Vu | 357/35 |
| 5,075,737 | 12/1991 | Shinohara | 257/349 |
| 5,172,209 | 12/1992 | Chang | 257/577 |
| 5,198,691 | 3/1993 | Tarng | 257/378 |

FOREIGN PATENT DOCUMENTS

| | | |
|---|---|---|
| 0068074 | 6/1981 | European Pat. Off. . |
| 0179196 | 6/1984 | European Pat. Off. . |
| 2227644 | 4/1974 | France . |
| 57-208175 | 12/1982 | Japan ........................ 257/350 |
| 61-15369 | 1/1986 | Japan ........................ 257/350 |
| 42304 | 1/1974 | U.S.S.R. . |
| 1397789 | 12/1972 | United Kingdom . |
| 1433667 | 4/1973 | United Kingdom . |

OTHER PUBLICATIONS

Dalal, H. M., et.al. "Gate Controlled Bistate Bipolar Transistor," IBM Technical Disclosure. 17(4). 1041. 1974(Sep.).
Wu, C. H., et.al. "An Analysis and the Fabrication Technology of the Lamdba Bipolar Transistor," IEEE Trans. on Electron Devices. 27(2). 414–419. 1980(Feb.).
Hori, T., et.al. "A New p–Channel MOSFET with Large-Tilt-Angle Implanted Punchthrough Stopper (LATIPS)," IEEE Electron Devices Letters. 9(12). 641–642. 1988(Dec.).
Okumura, Y., et. al. "Graded–Junction Gate/n– Overlapped LDD MOSFET Structures for High Hot–Carrier Reliability," IEEE Trans. on Electron Devices. 38(12). 2647–2656. 1991.
Parke et al., "A High–Performance Lateral Bipolar Transistor Fabricated on SIMOX," IEEE Electron Device Letters, vol. 14, No. 1, Jan. 1993, pp. 33–35.

*Primary Examiner*—Jerome Jackson
*Assistant Examiner*—Courtney A. Bowers
*Attorney, Agent, or Firm*—Arnold, White & Durkee

[57] ABSTRACT

The electronic component comprises, topologically integrated within the same semiconductor structure (1), a first semiconductor area (12, 13, 3, 4, 20) capable of forming an insulated-gate field-effect transistor, and a second semiconductor area (12, 20, 18, 19, 11) capable of forming a lateral bipolar transistor, the two areas having a common semiconductor layer (20) in which the channel of the field-effect transistor is capable of being formed and/or the base current of the bipolar transistor is capable of flowing, the two areas being capable together of forming a structure capable of negative dynamic resistance.

25 Claims, 8 Drawing Sheets

MULTI-FUNCTION ELECTRONIC COMPONENT, ESPECIALLY NEGATIVE DYNAMIC RESISTANCE ELEMENT, AND CORRESPONDING METHOD OF FABRICATION

The invention relates to multi-function semiconductor structures, capable in particular of a bipolar and/or field-effect transistor function, and/or capable of exhibiting negative dynamic resistance.

Existing technologies are known making it possible to produce field-effect and bipolar transistors which are topologically separated on a semiconductor substrate. The technology know as BiCMOS may be mentioned, for example, which groups, on the same silicon chip, insulated-gate N and P-channel transistors (CMOS transistor), associated for example with a NPN bipolar transistor. These transistors are topologically separated, as they are arranged side by side and completely isolated from one another.

Electronic components are also know, especially from the British Patent No. 1,397,789, which are capable of exhibiting negative dynamic resistance, that is to say a current/voltage configuration in which the current decreases when the voltage increases. However, such components are produced from discrete elements and consequently do not offer an integrated structure.

The U.S. Pat. No. 4,032,961 describes an integrated structure capable of exhibiting negative dynamic resistance, which incorporates a bipolar transistor controlled by a junction field-effect transistor (JFET transistor). Moreover, in such a structure, the emitter contact is situated on the substrate, which renders it incompatible with a CMOS/BiCMOS fabrication technology, since, in this case, the substrate would sere as common emitter for all the simultaneously fabricated transistors, and these would then no longer be isolated from one another.

No integrated structure is currently know which is capable of carrying out an insulated-gate field-effect transistor function, or a bipolar transistor function, possibly controlled by the former, and/or of exhibiting negative dynamic resistance.

The invention aims to remedy this omission.

An object of the invention is to propose such a component exhibiting a very compact integrated structure, requiring a smaller number of masks necessary for its fabrication.

The object of the invention is further to form such a component which is compatible with fabrication technologies of the BiCMOS type.

Hence the invention provides an electronic component comprising, topologically integrated within the same semiconductor structure, a first semiconductor area capable of forming an insulated-gate field-effect transistor, and a second semiconductor area capable of forming a lateral bipolar transistor; the two areas have a common semiconductor layer in which the channel of the field-effect transistor is capable of being formed and/or the base current of the bipolar transistor is capable of flowing; these two areas are moreover capable together of forming a negative dynamic resistance structure.

The field-effect transistor may have a P channel, associated with a bipolar transistor of the NPN type, or may also have an N channel, associated with a bipolar transistor of the PNP type.

According to one embodiment of the invention, the semiconductor structure includes a semiconductor block supporting the insulated projecting gate of the field-effect transistor; the common semiconductor layer extends into the upper part of the block under the gate, while the rest of the first area, capable of forming the field-effect transistor, extends on either side of the said common layer, and the second area, capable of forming the lateral bipolar transistor, is situated partially in the lower part of the block, offset laterally with respect to the first area.

This component advantageously includes an intrinsic collector extending into the lower region of the block up to a predetermined distance from the emitter region of the bipolar transistor thus defining the thickness of the base of the bipolar transistor, which may be submicronic.

This component preferably comprises a common contact for the base of the bipolar transistor and the drain of the field-effect transistor as well as separate contacts for the emitter and the collector of the bipolar transistor and the source of the field-effect transistor.

According to one embodiment of the invention, the semiconductor structure includes:

- a semiconductor substrate having a first type of conductivity, for example P type,
- an insulating layer situated on a part of a first face of the substrate, and supporting a first projecting semiconductor region, capable of forming the gate region of the field-effect transistor, and having the first type of conductivity, for example $P^+$ type,
- a first pair of semiconductor regions, localised within the substrate on either side of a first end area of the projecting region, capable of forming respectively, on the one hand, the source region and, on the other hand, the drain region or that of the base, and having the first type of conductivity, for example $P^+$ type,
- a second pair of semiconductor regions, localised within the substrate on either side of a second end area of the projecting region, opposite the first end area, capable of forming respectively the emitter region and that of the extrinsic collector, and having a second type of conductivity opposite to the first, for example $N^+$ type,
- a buried semiconductor layer, having the second type of conductivity, for example N type, and extending away from the first face of the substrate while being in contact with the region of the second pair capable of forming the extrinsic collector, and away from the other region of this second pair, capable of forming the emitter,
- a first metallisation arranged in contact with the region of the first pair capable of forming the drain or the base, and
- at least two other metallisations arranged respectively in contact with the two regions of the second pair or in contact, on the one hand, with the region capable of forming the source and, on the other hand, with the projecting region capable of forming the gate.

The projecting region and the four regions of the two pairs are advantageously overdoped, and the four regions of the two pairs preferably extend from the first face of the substrate as far as the opposite face.

In order to minimise the leakage currents through the rest of the substrate, it is particularly advantageous that the substrate of the semiconductor structure is a substrate on insulator.

Such a component may be used as a field-effect transistor; in this case, it includes at least three metallic contacts on the gate, source and drain regions.

In such a use, it is particularly advantageous to apply a chosen bias voltage to the collector region, fitted in this case with a metallic contact; this chosen bias voltage will be positive in the case of a P-channel field-effect transistor and negative in the case of a N-channel field-effect transistor.

Such a component may also be used as a bipolar transistor; in this case, it includes at least three metallic contacts on the base, collector and emitter regions.

In such a use, it is particularly advantageous to apply a chosen bias voltage to the gate, also fitted with a metallic contact; this chosen bias voltage will be negative in the case of a P-channel field-effect transistor, and positive in the case of an N-channel field-effect transistor.

The component according to the invention may also exhibit a negative dynamic resistance configuration; in this case, it includes metallic contacts on the gate, drain-base, collector and emitter regions.

It is possible, in such a use, although the emitter-base junction of the bipolar transistor is forward biased, to reverse bias the collector-base junction by applying a chosen bias to the gate in order at least partially to deplete the channel of the field-effect transistor.

The negative dynamic resistance may be obtained from the collector current/voltage relationship.

The subject of the invention is also a method of fabricating a semiconductor structure capable of integrating an insulated-gate field-effect transistor and a lateral bipolar transistor, in which:

- a) on a first face of a semiconductor substrate having a first type of conductivity (for example, P type), an insulated projecting region is produced, capable of forming the gate region of the field-effect transistor and also having the first type of conductivity, and, in the lower part of the substrate, a buried layer is produced, having a second type of conductivity, opposite to the first, and extending into a portion of the lower part of the substrate, at least under the projecting region,
- b) into the substrate, a first pair of semiconductor regions is implanted, localised on either side of a first end area of the projecting region, capable of forming respectively, on one hand, the source region and, on the other hand, the drain region or that of an extrinsic base, these two semiconductor regions of this first pair also having the first type of conductivity (for example $P^+$ type),
- c) into the substrate, a second pair of semiconductor regions is implanted, having the second type of conductivity, localised on either side of a second end area of the projecting region, opposite the first; one of these regions, situated outside the buried layer, is capable of forming the emitter region, the other region, situated in contact with the said buried layer, being capable of forming the extrinsic collector region, and
- d) the region of the first pair capable of forming a drain or base, and at least the two regions of the second pair or, on the one hand, the region capable of forming the source and, on the other hand, the projecting region capable of forming the gate, are metallised.

The steps of implantation of the four regions of the two pairs advantageously include overdopings, possibly gradual.

According to an implementation of the invention, in step a):

- a1) within the substrate a buried region is implanted, extending away from the first phase of the substrate and having the second type of conductivity, for example N type,
- a2) on the substrate thus implanted is formed a stack containing an insulating layer surmounted by a semiconductor layer having the first type of conductivity, for example $P^+$ type, itself surmounted by an upper layer (for example of silicon nitride) able to form an implantation mask,
- a3) at least a portion of this stack is removed in order to lay bare the corresponding portion of the first face of the substrate and in order to define at least one first side or terminal of the projecting region,
- a4) a chosen implantation of dopants of the structure thus obtained is carried out in order to delimit the said buried region and form the said buried layer.

According to a variant of the invention, the said chosen implantation of the buried region is carried out substantially perpendicularly to the first face of the substrate.

In this case, subsequent to step a4), another portion of the stack is advantageously removed in order to lay bare the corresponding portion of the first face of the substrate and in order to define the second side or terminal of the projecting region, this second side being opposite to the first; insulating lateral regions, or spacers, are arranged in contact with the two sides of the projecting gate region, these spacers having a predetermined width in the region of the first face of the substrate, and, in step c), the two regions of the second pair are implanted on either side of the insulating lateral regions or spacers.

In step b), in a first implantation area situated on either side of the spacers, and in the vicinity of the said first end area of the projecting region, it is possible to carry out a first chosen implantation of dopants in order to overdope (for example $P^+$) the said first implantation area with respect to the substrate, then the spacers are removed and, in a second implantation area prolonging the first up to the two terminals of the projecting region, a second implantation of the same type as the first is carried out, which makes it possible to obtain the two regions of the first pair with a non-uniform doping ($P^{++}$, $P^+$).

According to another variant of the invention, in step a3), another portion of the stack is removed in order, on the one hand, to lay bare the corresponding portion of the first face of the substrate and define the second side, or terminal of the projecting region, opposite to the first, and, on the other hand, to cause the said masking layer to overlap the upper face of this projecting region by a predetermined distance, then the chosen implantation of step a4) is carried out, in order to delimit the buried layer, along an oblique direction with respect to the first face of the substrate.

Then, advantageously, the two regions of the second pair, which are capable of forming the emitter and the collector are implanted, by carrying out a chosen implantation of dopant substantially vertically on the structure fitted with the overlapping mask fixed to the gate.

Advantageously also, the implantation of the two regions of the first pair which are capable of forming the drain and the source is carried out by performing a first chosen implantation of dopant substantially vertically on the structure fitted with the overlapping mask fixed to the gate, then, after having removed this mask, a second chosen implantation of dopant is carried out in order to obtain regions having a non-uniform doping ($P^+$, $P^{++}$).

Other advantages and characteristics of the invention will appear on examining the detailed description below and the attached drawings, in which.

Figure 3:
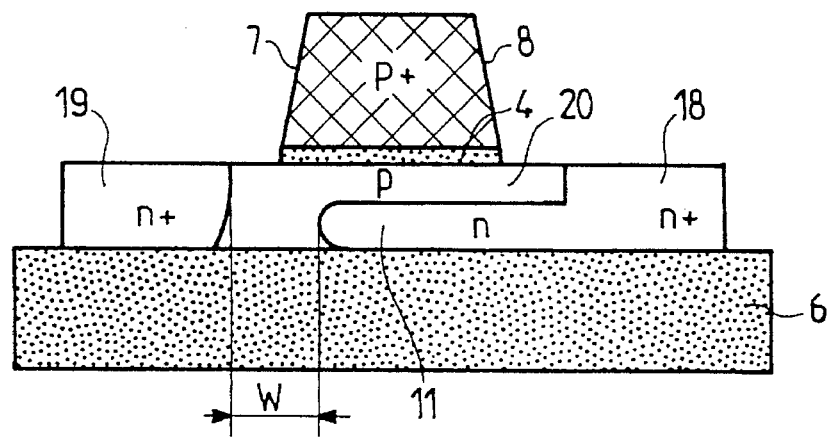
FIG. 3 is a diagrammatic section along line III—III of FIG. 1.
Figure 4A:
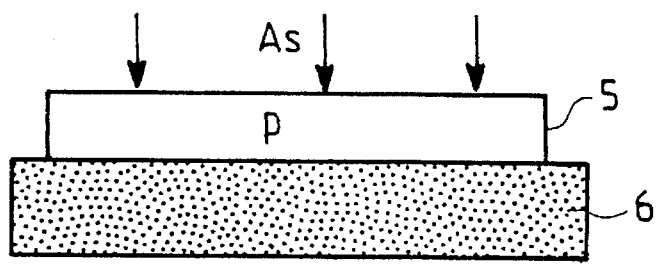
Figure 4B:
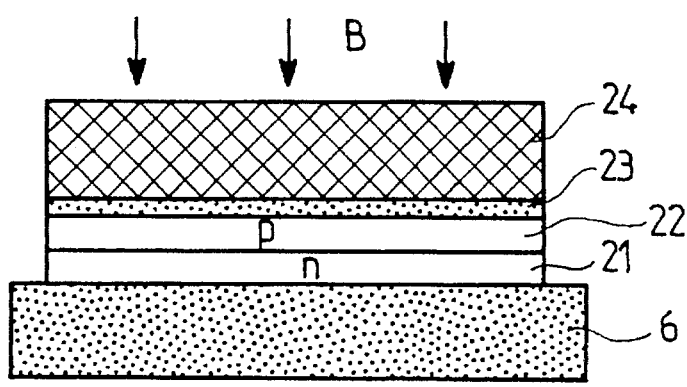
Figure 4C:
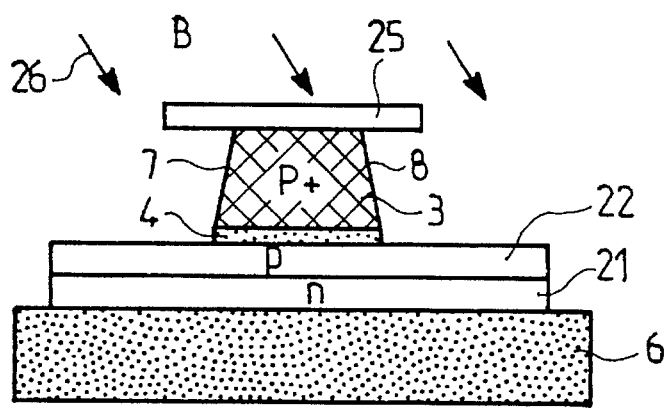
Figure 4D:
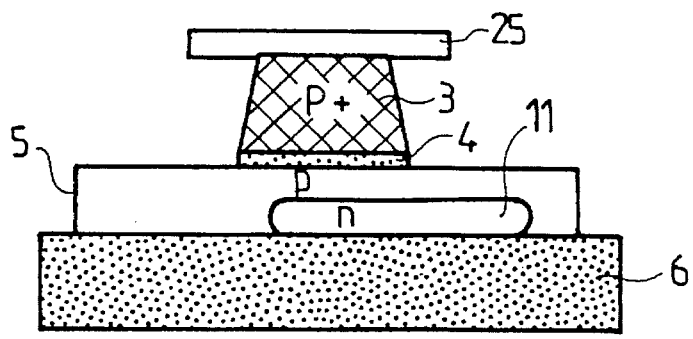
Figure 4E:
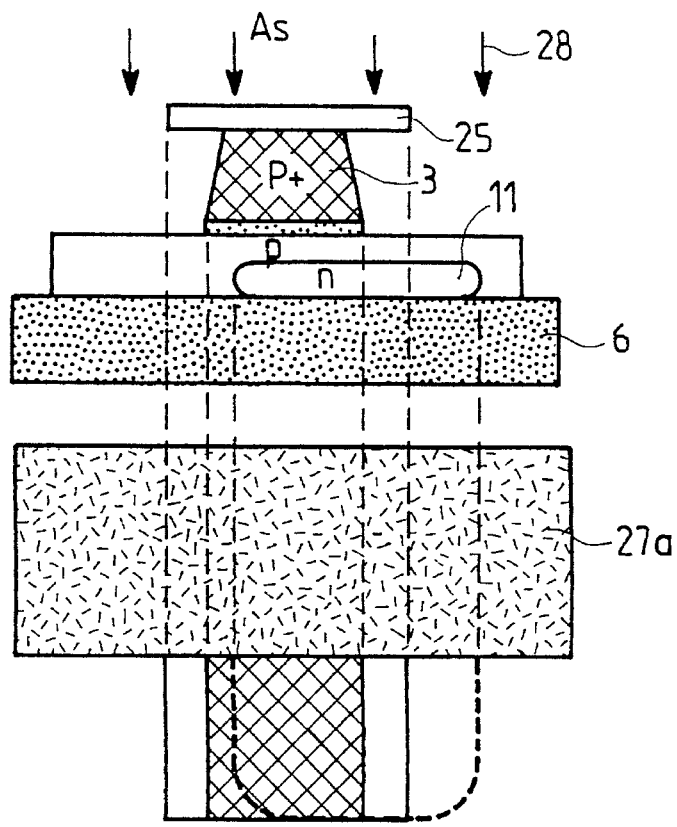
Figure 4F:
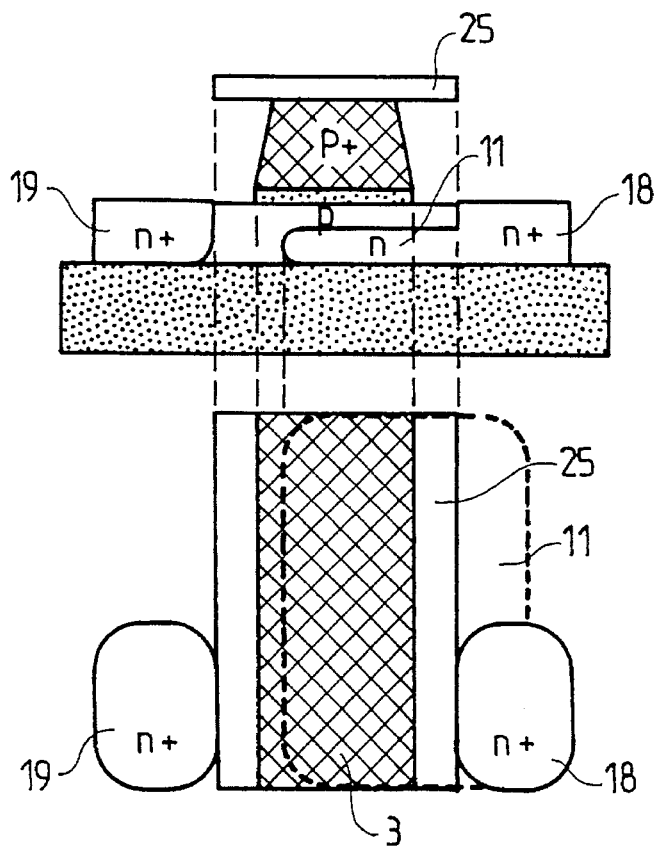
Figure 4G:
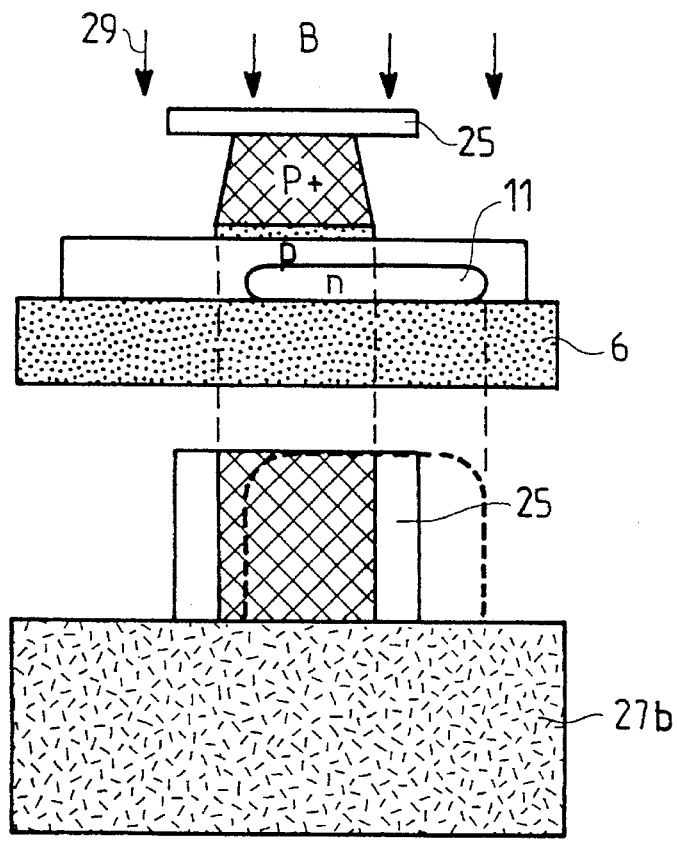
Figure 5A:
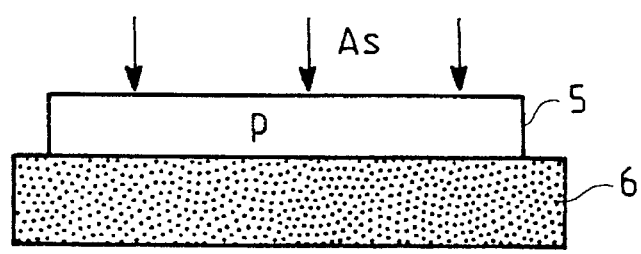
Figure 5B:
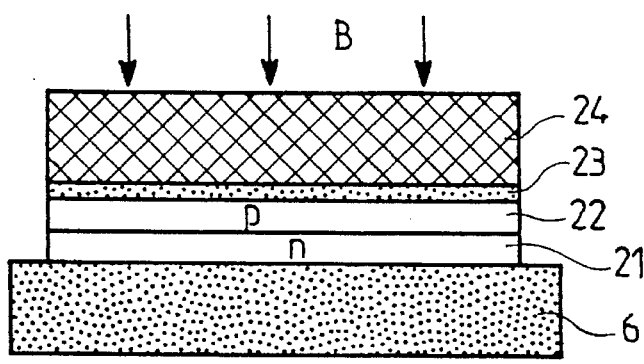
Figure 5C:
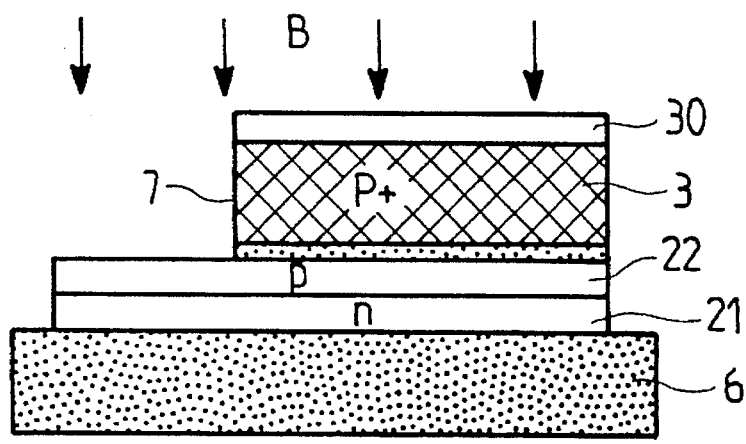
Figure 5D:
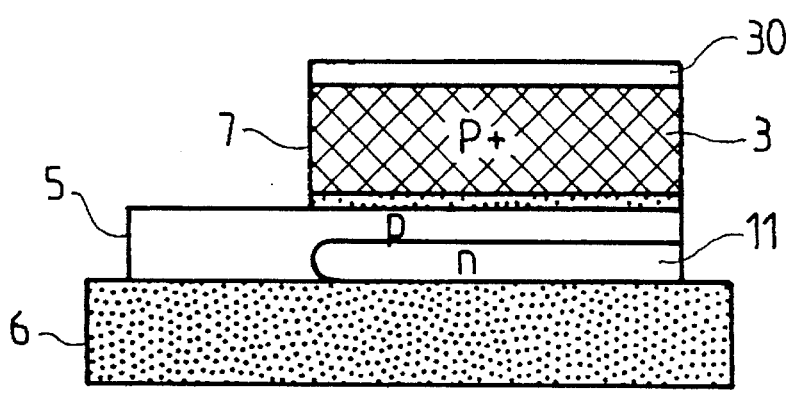
Figure 5E:
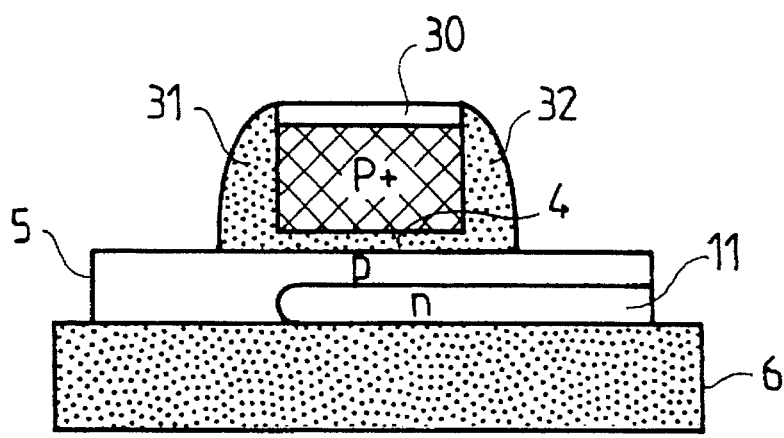
Figure 5F:
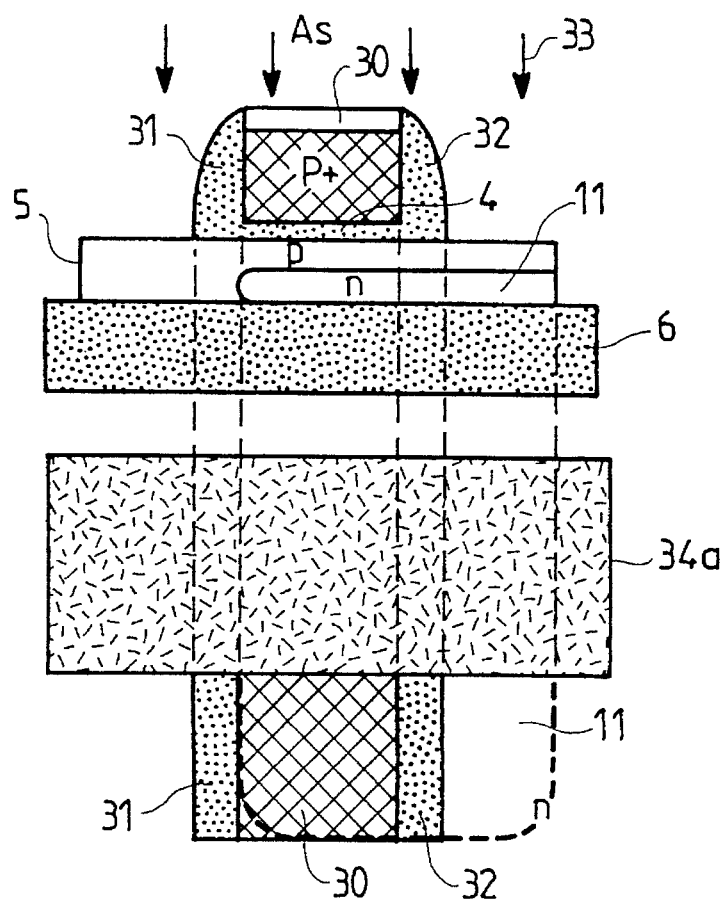
Figure 5G:
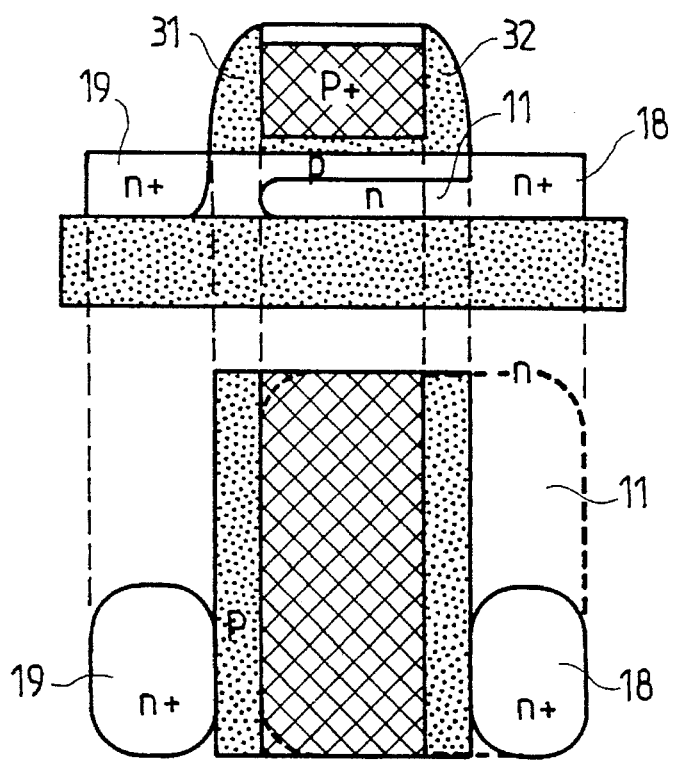
Figure 5I:
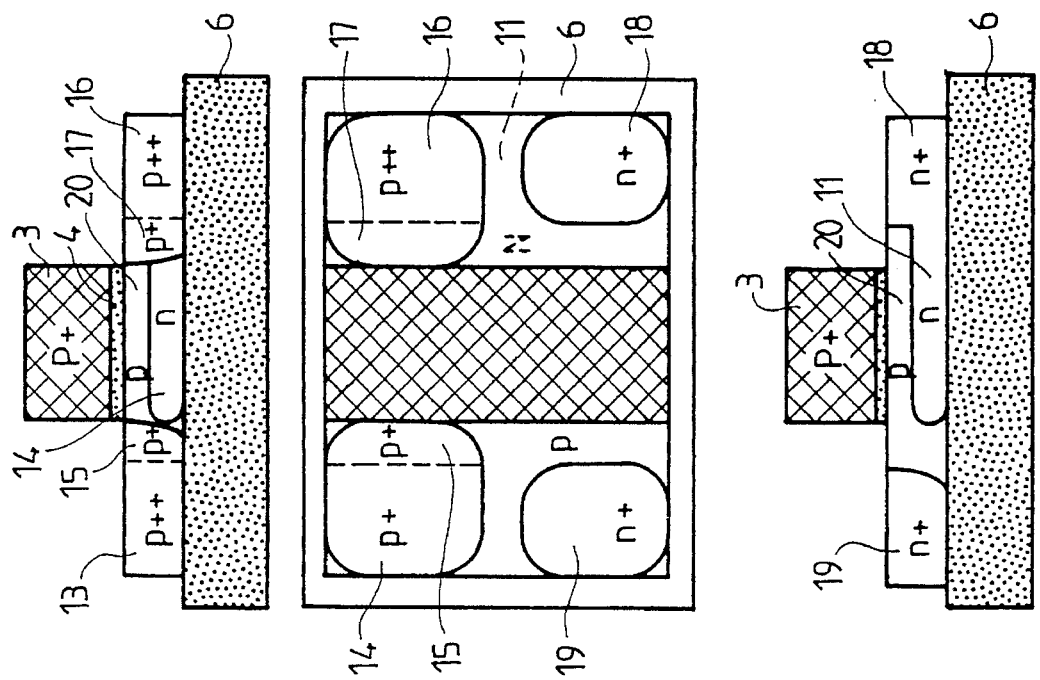
Figure 5H:
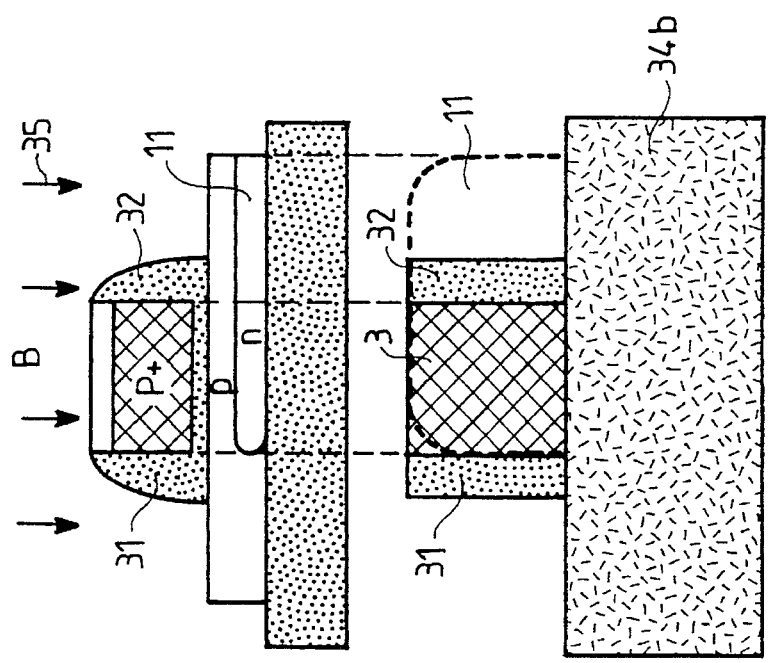
Figure 6:
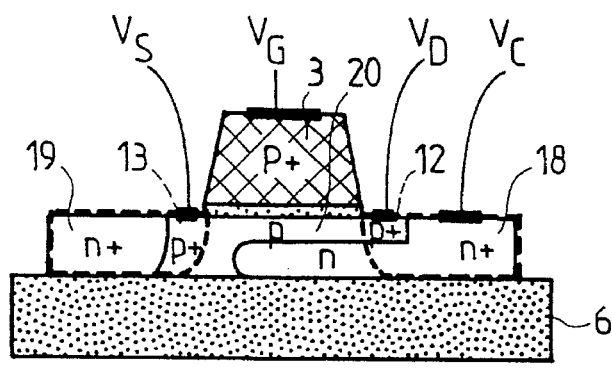
Figure 7:
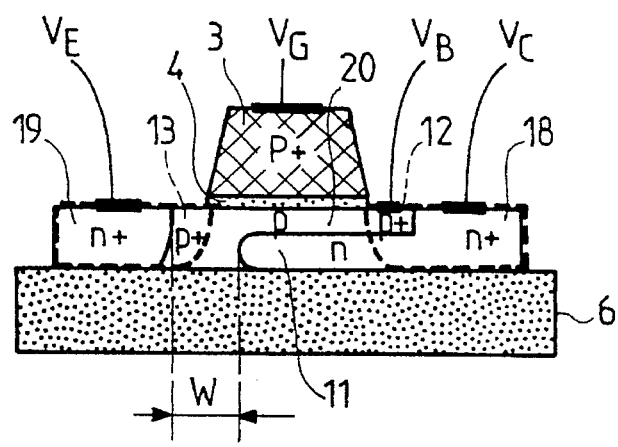
Figure 8:
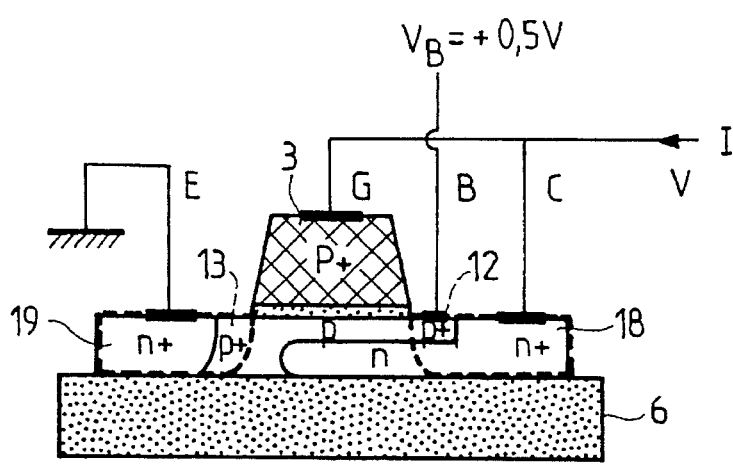
Figure 9:
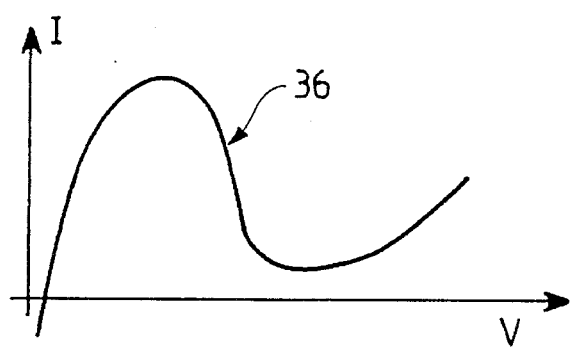

FIGS. 4a to 4g illustrate a first mode of implementation of the method of fabrication according to the invention, making it possible to obtain the structure illustrated in FIGS. 1 to 3, FIGS. 5a to 5h illustrate a second mode of implementation of the method of fabrication according to the invention, making it possible to obtain the semiconductor structure illustrated in FIG. 5i, FIG. 6 illustrates in a simplified way a use of the component according to the invention as a field-effect transistor, FIG. 7 illustrates, in a simplified way, a use of the component according to the invention as a bipolar transistor, and FIGS. 8 and 9 illustrate, in a simplified way, a use of the component according to the invention, capable of exhibiting negative dynamic resistance.

Figure 1:
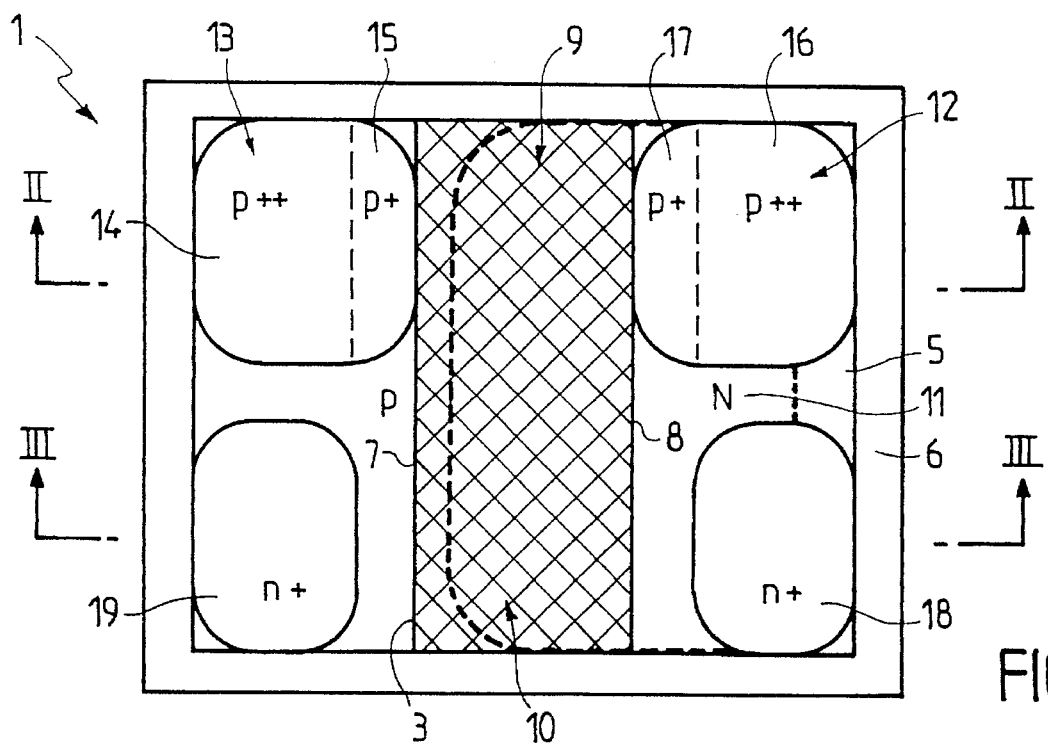
FIG. 1 is a top, diagrammatic view of an integrated structure according to the invention.

In FIG. 1, reference 1 designates a semiconductor structure, including a semiconductor block 2 composed of a substrate 5 resting on an insulator 6. The person skilled in the art will thus immediately understand that the semiconductor structure is produced here on the basis of a substrate on insulator, commonly designated under the English acronym SOI (silicon on insulator).

Such a substrate on insulator minimises the local leakage currents especially through the rest of the substrate. Nevertheless, it is possible to use a solid P-type substrate (for example), or even a solid N-type substrate in which a P-type well has been produced.

The substrate 5, produced based on silicon, has a width of the order of 5 μm, a length of the order of 5 μm, and a thickness of the order of 2000 angstroms.

The first face, or upper face, of the substrate 5 of the semiconductor block 2 supports an insulating layer 4, for example made of silicon dioxide, surmounted by a projecting region 3 produced from $P^+$ overdoped polycrystalline silicon, having the P type of conductivity (conduction by holes). This projecting region 3 includes two lateral sides, or terminals, 7 and 8, and the references 9 and 10 designate respectively first and second end areas of this projecting region 3.

In the lower part of the substrate 5, composed of P-type silicon, is a buried layer 11 having the opposite type of conductivity, that is to say N type (conduction by electrons). This buried layer 11, which lies at a distance from the upper face of the substrate, extends in a portion only of the lower part of the substrate 5, namely under the projecting region 3, overlapping the latter in the direction of its right side 8.

On either side of the first end area 9 of the projecting region 3 lie two implanted regions 12 and 13, having the P type of conductivity. These two regions are overdoped with a non-uniform overdoping. More precisely, the part 17 of the region 12, situated closest to the projecting region 3, has a $P^+$ type overdoping, that is to say a concentration of holes of the order of $10^{18}$ $cm^{-3}$, while the part 16 of this region 12, remotest from the projecting region 3, has an $P^{++}$ overdoping, that is to say a concentration of holes of the order to $10^{20}$ $cm^{-3}$. It will be recalled here that a P-type doping corresponds to a concentration of holes of the order of $10^{16}$ $cm^{-3}$.

In a symmetric way, the region 13 includes a part 15 which is $P^+$ doped and a part 14 which is $P^{++}$ doped.

These two regions, forming a first pair, extend from the upper face of the substrate substantially as far as the lower face. In this embodiment, the region 13 is not in contact with the buried layer 11, whereas the region 12 is.

On either side of the second end area 10 of the projecting region 3 lie two implanted regions 18 and 19 forming a second pair. These two regions have the N type of conductivity and are advantageously $N^+$ overdoped. They both extend from the upper face of the substrate substantially as far as its opposite face. The region 19, situated on the side of the left terminal 7 is not in contact with the buried layer 11, and lies at a predetermined distance w from it, the meaning of which will be examined in more detail later, and which is advantageously submicronic, typically of the order of 0.1 μm. The other region 18 of this second pair, situated on the side of the right terminal 8 of the projecting region, comes, in contrast, in contact with the buried layer 11.

Such a structure is fitted with metallisations which will allow the functions thereof to be defined.

In the preferential embodiment described here, the semiconductor structure includes five metallisations (not represented here for reasons of simplicity), although it is possible, as will be seen below, to have only three.

More precisely, each of the two regions 12 and 13 of the first pair and 18 and 19 of the second pair include a metallisation. A fifth metallisation is also provided on the projecting region 3. To this end, having regard to the fact that the width of this region may be less than 1 μm, it is preferable to provide a lateral extension (not represented for reasons of simplicity) of this region, for example extending the end area 9, which is wider and on which is arranged this fifth metallisation.

The semiconductor structure thus described includes two semiconductor areas. One of these areas is capable of forming an insulated-gate field-effect transistor. More precisely, the region 12 constitutes the drain of this transistor, while the region 13 constitutes its source. The projecting region 3 forms the gate region of this transistor. The channel of the field-effect transistor is capable of forming in the layer 20 of the substrate 5 situated partly above the buried N layer, in the upper part of the semiconductor block 2, under the gate 3.

The second semiconductor area is capable of forming a lateral bipolar transistor. More precisely, the region 12 constitutes the extrinsic base thereof, while the region 19 constitutes the emitter thereof and the region 18 constitutes the extrinsic collector thereof. The buried layer 11 forms the intrinsic collector and the distance w separating the end of this buried layer 11 from the emitter region 19 defines the thickness of the intrinsic base of the bipolar transistor. The person skilled in the art will note here that the base current of this bipolar transistor will be able to flow also in the upper layer 20. This upper layer is therefore common to the two semiconductor areas.

Moreover, as will be seen in detail later, these two areas form, in combination, a semiconductor structure capable of negative dynamic resistance.

A P-channel insulated-gate field-effect transistor has been described here, associated with a NPN-type lateral bipolar transistor. Needless to say, by reversing all the types of dopants, it would be possible to associate, within the same structure, a N-channel insulated-gate field-effect transistor with a PNP-type lateral bipolar transistor.

A first variant of a method of fabrication, making it possible to obtain the electronic component illustrated in FIGS. 1 to 3 will now be described in detail.

The starting product, illustrated in FIG. 4a, is a substrate on insulator, composed of a film 5 of P-type silicon on silicon dioxide 6. A first step consists of a deep implantation of dopants (arsenic or phosphorus) so as to form a buried N-type region 21 in the lower part of the film 5.

Next a layer of silicon dioxide 23 intended for forming the gate oxide is deposited on the upper face of the upper part 22 of the P-type substrate. Next, on this layer 23, an upper layer 24 of polycrystalline silicon is deposited, which is implanted (boron) in such a way as to confer $P^+$ type overdoping to it.

Next, on the polycrystalline silicon layer 24, a layer, for example of silicon nitride, is deposited, intended to form a mask for a subsequent implantation. Next the dimensions of this nitride table 25 are defined, and an isotropic attack of the polycrystalline silicon 24 is carried out so as to define the left and right terminals 7 and 8 of the gate 3. The nitride table overlaps the terminals of the gate by a chosen distance which is a determinant for the definition of the thickness of the base of the future bipolar transistor.

Next, on the structure thus obtained, and illustrated in FIG. 4c), an oblique implantation of boron is carried out at high energy 26, in such a way as to delimit the buried region 21 and thus define the N-type buried layer 11 (FIG. 4d). The oblique implantation is carried out here along an angle of the order of 45° to 60° with respect to the vertical. The nitride table has prevented the implantation of dopants within the gate 3.

The following step, illustrated in FIG. 4e, consists in depositing a mask 27a on the structure obtained at FIG. 4d, in the region of the first end area of the gate 3. Then an implantation of arsenic or of phosphorus is carried out at high energy 28, so as to form the two regions 18 and 19 of the second pair, illustrated in FIG. 4f. The mask 27a has the function of avoiding an implantation of dopants on either side of the first end area of the gate, and the use of the nitride table makes it possible to carry out an implantation of the regions 18 and 19 which is self-positioned with respect to the gate 3. Moreover, it will be noted here that, by reason of the overlapping of the nitride table 25 on either side of the gate 3, the region 19 lies at a distance from the buried layer 11, which physically represents the thickness w of the intrinsic base of the bipolar transistor.

In FIG. 4g the mask 27a has been etched and a mask 27b has been placed this time in the region of the second end area of the gate 3, above the regions 18 and 19, so as to be able to carry out a first high-dose boron implantation 29, in order to produce the two regions 12 and 13 of FIG. 1. Next the overlapping regions of the nitride table are etched, so as to carry out a second boron implantation in order to obtain a non-uniform doping of the regions 12 and 13, as illustrated in FIG. 1. This non-uniform doping is known to the person skilled in the art under the title LDD (lightly doped drain).

The nitride mask is next etched, in the same way as the mask 27b, and metallisations are produced on the desired regions, by depositing a layer of metal (for example titanium) in order to form a silicide on the semiconductor areas of silicon (TiSi$_2$).

The shading effect, coming into play during oblique implantation is in general considered by the person skilled in the art as a parasitic effect which gives rise, for example, to asymmetric characteristics of the insulated-gate transistor, a non-overlapping of the channel by the gate and an accelerated ageing of the structures. However, according to the invention, the use of this shading effect makes it possible to produce an electronic component which exhibits both the combined functions of an insulated-gate field-effect transistor, a bipolar transistor, and a transistor capable of exhibiting negative dynamic resistance, while using a reduced number of masks necessary for fabrication. Oblique implantation also makes it possible directly to delimit the buried intrinsic collector layer and, in combination with the nitride table, precisely to define the width of the base which may thus be very greatly reduced.

FIGS. 5a to 5h illustrate another variant of the method of fabrication according to the invention which will now be described in detail.

The first steps of this variant, illustrated in FIGS. 5a and 5b are identical to those which have been described in relation to FIGS. 4a and 4b and will not be repeated here.

Referring now more particularly to FIG. 5c, after having deposited a layer of nitride 30 on the P$^+$-doped polycrystalline silicon, with the aid of a mask the left terminal of the gate is defined and an anisotropic attack of the nitride and of the polycrystalline silicon is carried out so as effectively to form the left side or terminal of the gate 3.

Next an implantation of boron is carried out at high energy and substantially vertically, that is to say substantially perpendicularly to the upper face of the substrate, so as to delimit the buried lower region 21, of N type, in order to delimit the buried layer 11 (FIG. 5d).

Next, by analogy with the left terminal, the right terminal of the gate is defined and an anisotropic attack of the nitride and of the polycrystalline silicon is carried out so as effectively to form the right side of this gate. Then a deposition of silicon dioxide is carried out followed by an anisotropic attack, so as to form insulating lateral regions, or spacers, 31 and 32, on the sides of the gate. These spacers have, in the region of the upper face of the substrate, a predetermined width which will be a determinant for the definition of the width w of the base of the bipolar transistor.

The following step, illustrated in FIG. 5f, is similar to that which has been described in relation with FIG. 4e. In this variant, the spacers 31 and 32 play the role of the overlapping parts of the nitride table 25 of FIG. 4e. Thus, for example by arsenic implantation, are formed the N$^+$ over-doped regions, 18 and 19, illustrated in FIG. 5g, the region 19 being for this reason at a distance from the extremity of the buried layer 11 forming the intrinsic collector of the bipolar transistor.

The step illustrated in FIG. 5h is similar to that which has been described in relation with FIG. 4g. The mask 34a has been etched and another mask 34b is arranged so as to mask the second end area of the gate region as well as the N$^+$-type regions 18 and 19. A first boron implantation is carried out in a first implantation area situated on either side of the spacers 31 and 32. These spacers are next etched, then a second boron implantation is carried out in a second implantation area extending the first implantation area as far as the terminals of the gate 3, which makes it possible to obtain the non-uniform doping regions 14, 15, 16 and 17, illustrated in FIG. 5i.

Figure 2:
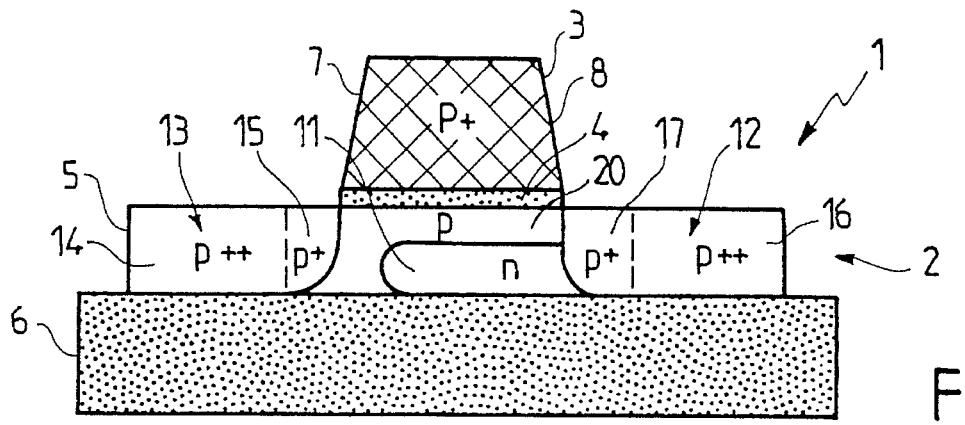
FIG. 2 is the diagrammatic section along line II—II of FIG. 1.

The semiconductor structure illustrated in this FIG. 5i differs from that illustrated in FIGS. 1 to 3, in that the end of the N-type buried layer 11 is in contact with the P$^+$-type implanted region 15. Nevertheless, the person skilled in the art will easily understand that this has no effect on the operation of the field-effect transistor or of the bipolar transistor, and, in a more general way, on the operation of the electronic component in its entirety. Moreover, this buried layer N extends to the edge of the substrate 5.

The method of fabrication according to the invention is compatible with fabrication technology of the BiCMOS type, as it is possible to use identical masks for fabricating these various types of transistors, especially as far as the deposition of the gate oxide and the fabrication of the gate regions are concerned.

Moreover, such a structure is also compatible with technology of the BiCMOS type, as the substrate does not serve as common emitter.

The electronic component according to the invention may be used simply as an insulated-gate field-effect transistor. In this case, it will only be necessary to provide three metallisations situated respectively on the drain, source and gate regions.

FIG. 6 illustrates a configuration of the component operating as a P-channel insulated-gate transistor. $V_S$, $V_G$ and $V_D$ respectively designate the source, gate and drain voltages. Under a zero gate voltage, the transistor is turned off by complete depletion of the channel. This complete depletion of the channel occurs at a zero gate voltage when the thickness of the layer 20 is less than or equal to about 1000 angstroms. Beyond that, it is advantageous to use additionally a positive collector bias, which will have the effect, in the present case, of pushing back the holes out of the channel and depleting the latter. Needless to say, it is appropriate to add a fourth metallisation on the extrinsic collector region 18 to the three basic metallisations of the electronic component according to the invention.

In operation, the gate voltage is negative and the collector voltage $V_C$ is kept constant (for example +1.5 V). The transistor then operates in accumulation mode.

Needless to say, in the case in which the electronic component includes a N-channel insulated-gate field-effect transistor, it would be appropriate to reverse the sign of all the bias voltages and especially to provide a negative collector voltage. Thus a NMOS transistor would be obtained, with a depleted channel at a zero gate voltage, which is completely unusual in this field. It should be stressed here that the MOS transistor function of this electronic component is fulfilled by a transistor operating in accumulation mode, which is very advantageous on a substrate on insulator, as it is more resistant to the avalanche effect in particular, which is well known to the person skilled in the art.

The component according to the invention may also be used as a bipolar transistor alone. In this case, it is necessary to have only the three basic metallisations, namely on the collector, emitter and base regions. The transistor then operates as a lateral bipolar transistor with a good electrical performance, since the thickness of the base w has been able to be adjusted according to the invention to very low values.

Moreover, this bipolar transistor may be controlled on its base by the field-effect transistor as illustrated in FIG. 7. In effect, the access resistance of the base may be reduced by using a negative gate bias $V_G$ (in the case of a P-channel field-effect transistor), which has the effect of creating an accumulation layer, which is very slightly resistive, in the common layer 20 below the gate. Tests have shown that the current gain of such a transistor is of the order of 100.

Needless to say, in the case of a PNP-type bipolar transistor, associated with a N-channel field-effect transistor, it would be appropriate to apply a chosen positive gate bias.

The semiconductor structure according to the invention may be used anywhere as negative dynamic resistance component, as illustrated in FIG. 8. Such a component is equipped with four metallisations on the gate, drain (and base) regions, on the one hand, and emitter and collector regions on the other hand. To this end, it is particularly advantageous to short circuit the metallic contacts of the gate and of the collector by making use, for example, of a metallisation common to these two regions.

The negative current I/voltage V characteristic will be observed in the region of the collector. When the voltage V is zero, the current I is negative. If the voltage V increases, the bipolar transistor is turned on, since the emitter-base junction is forward biased ($V_B$=+0.5 volt approximately). The positive collector-base potential difference reverse biases the collector-base junction. Consequently, the current I becomes positive and increases up to saturation level. Moreover, the biasing of the gate of the field-effect transistor increases, since it is directly equal to the collector voltage which is itself equal to the voltage V. This results in a depletion of the channel, and thus a gradual cutoff of the passage of current in the base of the bipolar transistor. Consequently, the current I decreases as from the start of the depletion of the channel. The increase in the current I at high voltage V, will be due either to the phenomenon of piercing of the base, or to avalanche in the collector-base junction.

Tests have revealed an abrupt decrease 36 in the current I of the order of 6 decades (FIG. 9). The amplitude of this decrease depends on the value of the voltage $V_B$.

The holding of the gate voltage and that of the collector at a common chosen value V (which is increased in the present case), has been judged to be preferential. Nevertheless, such a condition is not absolutely necessary. In effect, the negative resistance configuration may also be obtained in the region of the collector by fixing the gate voltage at a chosen value (in order partially to deplete the channel), or even by applying no voltage to this gate ("floating" gate, the projecting region then possibly not being equipped with a metallisation). In this case, only the increase in the collector voltage V will lead to the depletion of the channel by means of the extension of the space charge region of the PN junction formed by the layers 20 and 11 which will be more heavily reverse biased as the collector voltage increases.

Because of the simplified mode of representation of FIGS. 6 to 8, the source and drain (base) contacts have been represented, for the sake of greater clarity, very close to the projecting region, although in reality they are arranged in contact with almost all of the regions in question.

The invention has made it possible to obtain, in a single structure, having a very compact geometric shape, the functions of an insulated-gate field-effect transistor and bipolar transistor, as well as that of a negative dynamic resistance structure. In this very compact structure, the localisation of the transport of the current takes place at two levels, namely the upper level where the channel of the field-effect transistor appears, as well as the transport of the base current of the bipolar transistor (common layer 20) and the lower level in which the bipolar action takes place (emitter 19, base of thickness w and collector 11, 18).

The bipolar transistor is of particularly high performance and is useable in BiCMOS technology. The field-effect transistor operates in accumulation and the negative dynamic resistance component makes it possible to produce a static memory point of small dimensions, as well as signal generators or automatic regulation/ stabilisation circuits of an operating point. All these functions find their applications directly in integrated circuits for telecommunication systems.

We claim:

1. An electronic component comprising, integrated within the same semiconductor structure:

a first semiconductor area forming an insulated-gate field-effect transistor having a drain, a source, and an insulated gate;

a second semiconductor area forming a lateral bipolar transistor having an emitter, a base and a collector region;

the first and second semiconductor areas having a common semiconductor layer comprising a channel of the insulated-gate field-effect transistor and in which a base current of the bipolar transistor flows when appropriate voltages are applied to the second semiconductor area during use; the channel of the insulated-gate field-effect transistor being a P channel if the lateral bipolar transistor is an NPN transistor and the channel of the insulated-gate field-effect transistor being an N channel if the lateral bipolar transistor is a PNP transistor;

wherein the two semiconductor areas together form a structure exhibiting negative dynamic resistance when appropriate voltages are applied to the semiconductor structure during use.

2. The electronic component of claim 1, further comprising a semiconductor block supporting said insulated gate of the field-effect transistor, wherein the common semiconductor layer extends in an upper part of the semiconductor block under said gate, a portion of the first semiconductor area that is not part of the common semiconductor layer extends on a side of the common layer, and the second semiconductor area partially lies in a lower part of the semiconductor block and is offset laterally with respect to the first semiconductor area.

3. The electronic component of claim 2, wherein said collector region comprises an intrinsic collector extending into the lower part of the block up to a predetermined distance from said emitter of the bipolar transistor thereby defining a thickness of said base of the bipolar transistor.

4. The electronic component of claim 3, characterized in that the thickness of the base is submicronic.

5. The electronic component of claim 3, further defined as comprising a common metallic contact for the base of the bipolar transistor and the drain of the field-effect transistor and separate metallic contacts for the emitter, the collector region of the bipolar transistor, and the source of the field-effect transistor.

6. The electronic component of claim 1, wherein the semiconductor structure is further defined as comprising:

a semiconductor substrate having a first conductivity, an insulating layer situated on a part of a first face of the substrate, and supporting a first projecting semiconductor region that forms the gate of the field-effect transistor and has the first type of conductivity, a first of semiconductor regions, localized within the substrate on either side of a first end area of the projecting region that form, respectively, the source and the drain, the drain and the source having the first type of conductivity, a second pair of semiconductor regions, localized within the substrate on either side of a second area of the projecting region, opposite the first end area that form respectively the emitter and an extrinsic collector of said collector region and has a second type of conductivity that is opposite to the first type of conductivity, a buried semiconductor layer having the second type of conductivity, located on a face of the substrate which is opposite from the first face of the substrate while being in contact with the region of the second pair that forms the extrinsic collector, and away from the other region of the second pair, a first metallization arranged in contact with the region of the first pair of semiconductor regions that forms the drain, a second metallization arranged in contact with the region of the first pair of semiconductor regions that forms the source, and a third metallization arranged in contact with the projecting region.

7. The electrical component of claim 6, wherein the projecting region and the four regions of the two pairs of semiconductor regions are more doped than the buried layer.

8. The electric component of claim 6, wherein the four regions of the two pairs of semiconductor regions are further defined as extending from the first face of the substrate to an opposite face.

9. The electric component of claim 1, wherein a substrate of the semiconductor structure comprises an insulator.

10. The electronic component of claim 1, comprising at least three metallic contacts on the base, collector region and emitter of said bipolar transistor.

11. The electronic component of claim 1, comprising at least three metallic contacts on the gate, source and drain of said field-effect transistor.

12. The electronic component of claim 1, the component being further defined as comprising metallic contacts at least on the drain, base, collector region and emitter.

13. A method of using the electronic component of claim 11, comprising:

providing an additional fourth metallic contact on the collector region;

choosing a bias voltage that is positive if the field-effect transistor is a P-channel field-effect transistor and negative if the field-effect transistor is a N-channel field-effect transistor; and applying the bias voltage to the collector region.

14. A method of using the electronic component of claim 10, comprising:

providing an additional fourth metallic contact on the gate;

choosing a bias voltage that is negative if the field-effect transistor is a P-channel field-effect transistor and positive if the field-effect transistor is a N-channel field-effect transistor; and applying the bias voltage to the gate.

15. A method of using the electric component of claim 12, comprising:

biasing an emitter-base junction of the bipolar transistor forward; and biasing a collector-base junction in reverse.

16. The method of claim 15, comprising:

providing a metallic contact on the gate of the field-effect transistor;

choosing a bias; and applying the chosen bias to the gate.

17. The method of claim 15, wherein the negative dynamic resistance is obtained from a collector current/voltage relationship.

18. An electronic component comprising, integrated within the same semiconductor structure:

a first semiconductor area including an insulated gate semiconductor region and a channel semiconductor region of an insulated-gate field effect transistor, and a second semiconductor area including an emitter semiconductor region, a collector semiconductor region and a base semiconductor region of a lateral bipolar transistor, said base region having a first zone and a second zone both located under the insulated gate region, said first zone being horizontally located between the emitter region and a first part of the collector region located under the insulated gate region, said second zone being laterally offset with respect to said first zone and vertically located between the insulated gate region and said first part of the collector region, said first and second semiconductor areas having a common semiconductor layer including the channel region and said second zone of the base region, said first and second semiconductor areas together forming a semiconductor structure adapted to have a negative dynamic resistance.

19. An electronic component, comprising a semiconductor structure comprising:

a semiconductor substrate having a first type of conductivity, an insulating layer situated on a part of a first face of the substrate, and supporting a first projecting semiconductor region forming a gate region of an insulated-gate field-effect transistor, and having the first type of conductivity, second and third semiconductor regions, localized within the substrate on either side of a first end area of the first projecting region, forming respectively a source region and a drain region of the insulating-gate field-effect transistor and having the first type of conductivity, fourth and fifth semiconductor regions, localized within the substrate on either side of a second end area of the projecting region, opposite the first end area, and having a second type of conductivity that is opposite to the first type of conductivity, a buried semiconductor layer having the second type of conductivity, and lying within the semiconductor substrate, being spaced from the first face of the substrate while being in contact with the fifth region, and being spaced from the fourth region, and a first metallization arranged in contact with the first projecting region and second and third metallizations arranged respectively in contact with the second region and with the third region.

20. A method of using the electric component of claim 19, comprising choosing first, second and third bias voltages adapted for using the electric component as a field effect transistor and applying said first, second and third bias voltages to said first, second and third metallizations.

21. An electronic component comprising a semiconductor structure comprising:

a semiconductor substrate having a first type of conductivity, an insulating layer situated on a part of a first face of the substrate, and supporting a first projecting semiconductor region having the first type of conductivity, second and third semiconductor regions, localized within the substrate on either side of a first end area of the first projecting region, and having the first type of conductivity, said third region forming part of a base region of a lateral bipolar transistor, fourth and fifth semiconductor regions, localized within the substrate on either side of a second end of the projecting region, opposite the first end area, having a second type of conductivity that is opposite to the first type of conductivity, and forming respectively an emitter region and an extrinsic collector region for said lateral bipolar transistor, a buried semiconductor layer having the second type of conductivity, and lying within the semiconductor substrate, being spaced from the first face of the substrate while being in contact with the fifth region, and being spaced from the fourth region, a first metallization arranged in contact with the third semiconductor region, and a second and a third metallizations arranged respectively in contact with the fourth and fifth regions.

22. The electric component of claim 21, wherein said first projecting region forms a gate region of an insulated gate field effect transistor, and a fourth metallization is arranged in contact with the first projecting region.

23. A method of using the electric component of claim 21, comprising choosing first, second and third bias voltages adapted for using the electric component as a bipolar transistor and applying said first, second and third bias voltages to said first, second and third metallizations.

24. A method of using the electric component of claim 22, comprising:

choosing first, second and third bias voltages adapted for using the electric component as a bipolar transistor and applying said first, second and third bias voltages to said first, second and third metallizations, choosing a fourth bias voltage that is negative in the case of a P-channel field-effect transistor and positive in the case of a N-channel field-effect transistor; and applying the fourth bias voltage to the fourth metallization.

25. An electronic component, comprising a semiconductor structure including:

a semiconductor substrate having a first type of conductivity, an insulating layer situated on a part of a first face of the substrate, and supporting a first projecting semiconductor region forming a gate region of an insulated-gate field-effect transistor, and having the first type of conductivity, second and third semiconductor regions, localized within the substrate on either side of a first end area of the first projecting region, and having the first type of conductivity, said second region forming a source region and said third region forming a drain region of the insulating-gate field-effect transistor and part of a base region of a lateral bipolar transistor, fourth and fifth semiconductor regions, localized within the substrate on either side of a second end area of the projecting region, opposite the first end area, and having a second type of conductivity that is opposite to the first type of conductivity, said fourth and fifth regions forming respectively an emitter region and an extrinsic collector region of the lateral bipolar transistor, a buried semiconductor layer having the second type of conductivity, and lying within the semiconductor substrate, being spaced from the first face of the substrate while being in contact with the fifth region, and being spaced from the fourth region, a first metallization arranged in contact with the third semiconductor region, second and third metallizations arranged respectively in contact with the first projecting region and with the second region, and fourth and fifth metallizations arranged respectfully in contact with the fourth and fifth regions, a semiconductor substrate having a first conductivity, an insulating layer situated on a part of a first face of the substrate, and supporting a first projecting semiconductor region that forms the gate of the field-effect transistor and has the first type of conductivity, a first pair of semiconductor regions, localized within the substrate on either side of a first end area of the projecting region that form, respectively, the source and the drain, the drain and the source having the first type of conductivity, a second pair of semiconductor regions, localized within the substrate on either side of a second area of the projecting region, opposite the first end area that form respectively the emitter and an extrinsic collector of said collector region and has a second type of conductivity that is opposite to the first type of conductivity, a buried semiconductor layer having the second type of conductivity, located on a face of the substrate which is opposite from the first face of the substrate while being in contact with the region of the second pair that forms the extrinsic collector, and away from the other region of the second pair, a first metallization arranged in contact with the region of the first pair of semiconductor regions that forms the drain, a second metallization arranged in contact with the region of the first pair of semiconductor regions that forms the source, and a third metallization arranged in contact with the projecting region.

* * * * *

UNITED STATES PATENT AND TRADEMARK OFFICE
CERTIFICATE OF CORRECTION

PATENT NO. : 5,552,624
DATED : September 3, 1996
INVENTOR(S) : Tomasz Skotnicki, et al It is certified that error appears in the above-indentified patent and that said Letters Patent is hereby corrected as shown below:

In claim 6, column 11, line 33, after "first" insert --pair--.

In claim 25, column 14, line 53, delete line 53 through column 16, line 8.

Signed and Sealed this

Twelfth Day of November, 1996

Attest:

BRUCE LEHMAN

*Attesting Officer*     *Commissioner of Patents and Trademarks*